United States Patent
Hu et al.

(10) Patent No.: US 10,163,733 B2
(45) Date of Patent: Dec. 25, 2018

(54) METHOD OF EXTRACTING DEFECTS

(71) Applicant: Taiwan Semiconductor Manufacturing Co., Ltd., Hsin-Chu (TW)

(72) Inventors: Jia-Rui Hu, Taichung (TW);
Shu-Chuan Chuang, Hsinchu (TW);
Che-Yuan Sun, Hualien County (TW);
Chih-Ming Ke, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 193 days.

(21) Appl. No.: 15/168,785

(22) Filed: May 31, 2016

(65) Prior Publication Data

US 2017/0345725 A1 Nov. 30, 2017

(51) Int. Cl.
| H01L 21/66 | (2006.01) |
| G06F 17/50 | (2006.01) |
| H01L 21/768 | (2006.01) |
| H01J 37/28 | (2006.01) |
| G03F 1/84 | (2012.01) |

(52) U.S. Cl.
CPC .......... *H01L 22/12* (2013.01); *G03F 1/84* (2013.01); *G06F 17/5068* (2013.01); *H01J 37/28* (2013.01); *H01L 21/76801* (2013.01)

(58) Field of Classification Search
CPC ........................................... H01L 22/12
USPC .......................................... 716/52
See application file for complete search history.

(56) References Cited

U.S. PATENT DOCUMENTS

| 6,902,855 | B2 | 6/2005 | Peterson et al. |
| 7,194,709 | B2 | 3/2007 | Brankner |
| 7,752,584 | B2 | 7/2010 | Yang |
| 8,681,326 | B2 | 3/2014 | Wu et al. |
| 8,716,841 | B1 | 5/2014 | Chang et al. |
| 8,736,084 | B2 | 5/2014 | Cheng et al. |
| 8,737,717 | B2 | 5/2014 | Lin et al. |
| 8,837,810 | B2 | 9/2014 | Chen et al. |
| 8,984,450 | B2 | 3/2015 | Hu et al. |
| 8,994,815 | B2 | 3/2015 | Mito et al. |
| 9,081,289 | B2 | 7/2015 | Chang et al. |
| 9,201,022 | B2 | 12/2015 | Hu et al. |
| 2007/0130557 | A1* | 6/2007 | Luk-Pat ............... G03F 1/84 716/52 |
| 2008/0016481 | A1* | 1/2008 | Matsuoka .......... G06F 17/5081 716/52 |

(Continued)

OTHER PUBLICATIONS

Barty, Anton et al, "EUVL mask blank repair" Emerging Lithographic Technologies VI, Roxann L. Engelstad, Editor, Proceedings of SPIE vol. 4688 (2002).

*Primary Examiner* — Suresh Memula
(74) *Attorney, Agent, or Firm* — Haynes and Boone, LLP

(57) ABSTRACT

A method provides a design layout having a pattern of features. The design layout is transferred onto a substrate on a semiconductor substrate using a mask. A scanning parameter is determined based on the design layout. An image of the substrate is generated using the determined scanning parameter. A substrate defect is identified by comparing a first number of closed curves in a region of the image and a second number of polygons in a corresponding region of the design layout.

20 Claims, 18 Drawing Sheets

(56) References Cited

U.S. PATENT DOCUMENTS

| | | | |
|---|---|---|---|
| 2009/0024967 A1* | 1/2009 | Su | G03F 1/36 |
| | | | 716/136 |
| 2012/0308112 A1 | 12/2012 | Hu et al. | |
| 2013/0117723 A1* | 5/2013 | Toyoda | G06K 9/00 |
| | | | 716/112 |
| 2013/0170757 A1* | 7/2013 | Shinoda | G06K 9/00 |
| | | | 382/209 |
| 2013/0201461 A1 | 8/2013 | Huang et al. | |
| 2013/0258304 A1 | 10/2013 | Chang et al. | |
| 2014/0101624 A1 | 4/2014 | Wu et al. | |
| 2014/0111779 A1 | 4/2014 | Chen et al. | |
| 2014/0119638 A1 | 5/2014 | Chang et al. | |
| 2014/0123084 A1 | 5/2014 | Tang et al. | |
| 2014/0226893 A1 | 8/2014 | Lo et al. | |
| 2014/0253901 A1 | 9/2014 | Zhou et al. | |
| 2014/0256067 A1 | 9/2014 | Cheng et al. | |
| 2014/0257761 A1 | 9/2014 | Zhou et al. | |
| 2015/0146968 A1 | 5/2015 | Tien et al. | |
| 2016/0132627 A1 | 5/2016 | Tsai et al. | |
| 2018/0012349 A1* | 1/2018 | Sakai | G06T 7/0004 |

* cited by examiner

METHOD OF EXTRACTING DEFECTS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

For example, the need to perform higher resolution lithography processes grows. One lithography technique used to address this need is extreme ultraviolet lithography (EUVL). Masks used in EUVL present new challenges. For example, a multi-layer (ML) structure is used in an EUVL mask, and a microscopic non-flatness (caused by a defect, for example) on a surface of the substrate of the EUVL mask may deform the films deposited subsequently thereon. When an incident light is reflected from a deformed region, also referred to as a phase defect, it may experience a phase difference with respect to a light reflected from a normally formed region. A phase defect may affect print fidelity and result in severe pattern distortion on a wafer substrate. However, conventional mask inspections may not efficiently identify the phase defect, especially when the phase defect is caused by a defect located at a lower portion of the ML structure. Furthermore, conventional wafer defect inspections may identify a huge number of potential defects, and the process to eliminate the nuisance defects while keeping defects of interest (e.g., caused by the phase defect of the EUVL mask) may be difficult, expensive, and time consuming.

Therefore, it is desired to provide an efficient and a feasible method to detect and classify defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A and 10B illustrate a substrate contour image being aligned with a design layout according to one or more aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Furthermore, relative terms such as top, bottom, over, under and the like are used for ease of reference and provide a special relationship between features for ease of understanding only and do not necessitate any specific orientation of a device. Further still, various features may be arbitrarily drawn in different scales for simplicity and clarity.

Various defect types may be used herein to describe the defects in a wafer. For example, yield-impacting defects (also referred to as defects-of-interest (DOI) or critical defects) may be used to describe defects in a die that affect yield, performance, or reliability, while nuisance defects may be used to describe defects that do not affect yield, performance, or reliability, or are otherwise not of interest. Examples of DOI may include defects that reside in a critical area of a die. Examples of nuisance defects may include defects that reside in dummy areas of a die, and critical dimension (CD) variations.

Yield-impacting defects may be caused by various problems. For example, some yield-impacting defects may be caused by problems related to circuit design, mask design, or by the implementation of optical proximity correction (OPC) features. These issues may manifest themselves repeatedly in the wafers and/or chips, and may be referred to as repeating defects. In other words, tuning fabrication process parameters will not reduce or eliminate repeating defects. On the other hand, some yield-impacting defects may be attributed to a variety of factors such as unexpected/unforeseen fabrication process variations, contaminant particles, human errors, machine errors, etc., and may be referred to as random defects. As such, the random defects may not be completely eliminated even if circuit or mask designs are optimized. Hence, it may be desirable to identify repeating defects so that corrective actions (e.g., modifications to the photomask or the circuit design) may be taken to reduce or eliminate these defects from future wafers.

Figure 1:
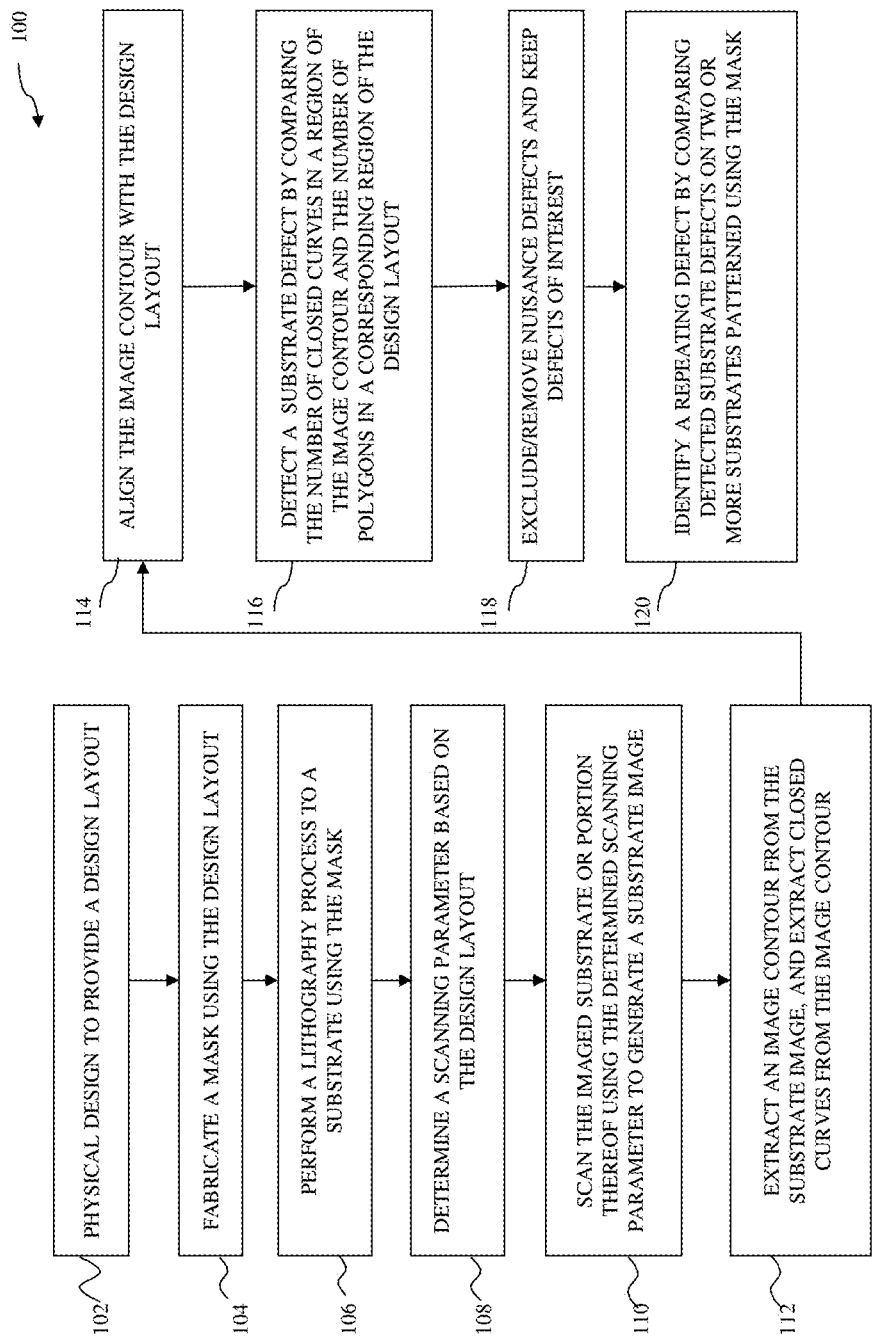
FIG. 1 is a flow chart of an embodiment of a method of extracting defects according to one or more aspects of the present disclosure.

Referring now to FIG. 1, illustrated is a method 100 of preparing the design layout, manufacturing a mask (or photomask or reticle) according to the design layout, and/or inspecting a substrate imaged using the mask to identify repeating defects according to one or more aspects of the present disclosure according to one or more aspects of the present disclosure.

Figure 2:
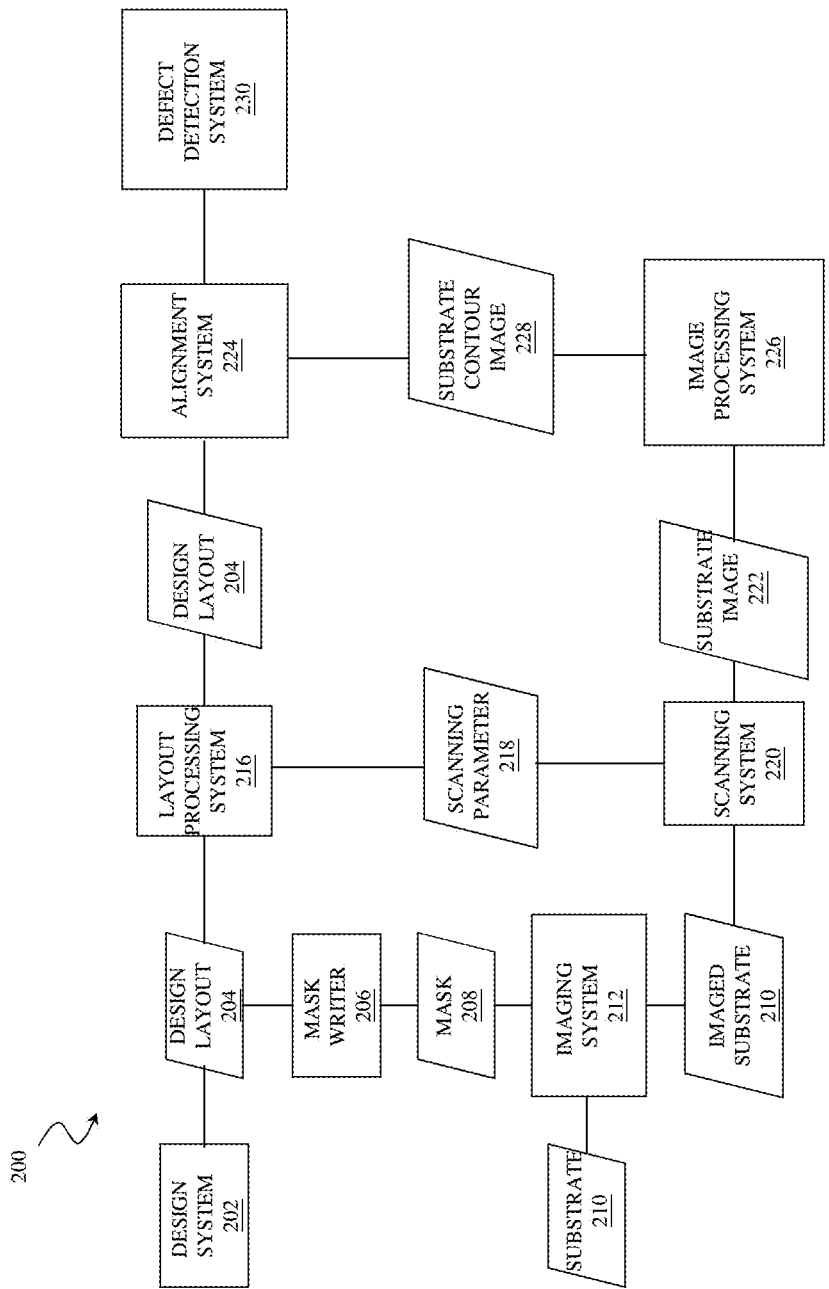
FIG. 2 is a block diagram of an embodiment of an integrated circuit (IC) design, fabrication, and defect detection system according to one or more aspects of the present disclosure.

Referring now to FIG. 2, illustrated is a block diagram of a system 200 that provides for preparing the design layout, manufacturing a mask according to the design layout, and/or inspecting a substrate patterned using the mask to identify repeating defects according to one or more aspects of the present disclosure. The system 200 includes an electronic design system 202, a mask writer 206, an imaging system 212, a layout processing system 216, a scanning system 220, an alignment system 224, an image processing system 226, and a defect detection system 230. It is noted that while the layout processing system 216, the scanning system 220, the alignment system 224, the image processing system 226, and the defect detection system 230 are illustrated separately, they may be components of the same system. In an embodiment, the system 200 implements the method 100 of FIG. 1.

Figure 3:
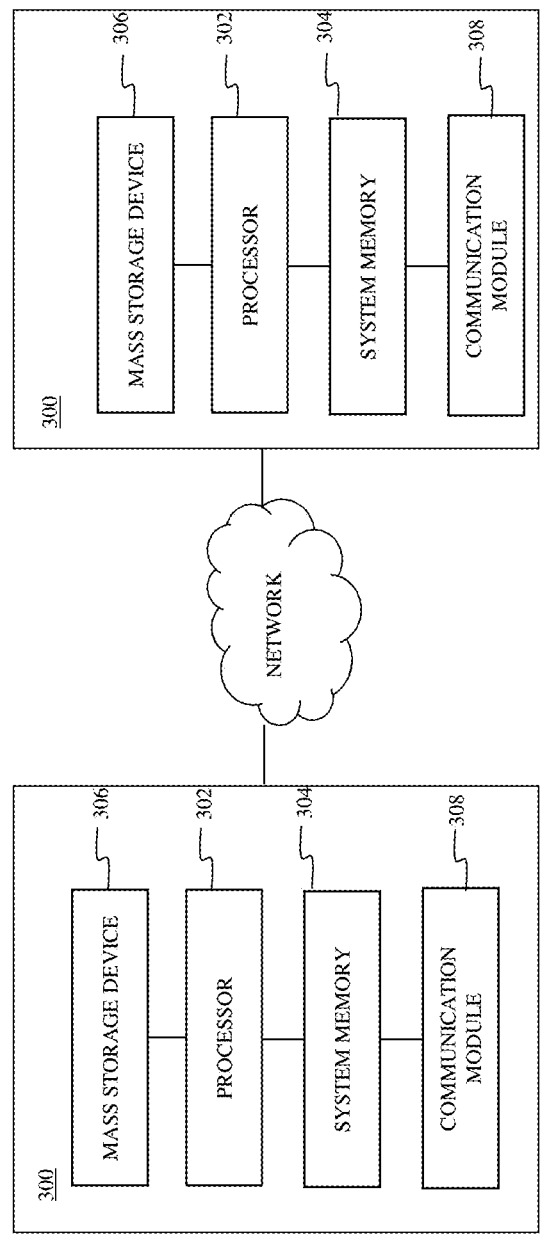
FIG. 3 is detailed block diagram of portions of the system of FIG. 2, according to one or more aspects of the present disclosure.

Referring now to FIG. 3, illustrated are two information handling systems 300 connected to each other through a network. One or more of the layout processing system 216, the scanning system 220, the alignment system 224, the image processing system 226, and the defect detection system 230 of FIG. 2 may include the information handling systems 300. The information handling system 300 is an information handling system such as a computer, server, workstation, or other suitable device. The system 300 includes a processor 302 that is communicatively coupled to a system memory 304, a mass storage device 306, and a communication module 308. The system memory 304 provides the processor 302 with non-transitory, computer-readable storage to facilitate execution of computer instructions by the processor. Examples of system memory 303 may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 306. Examples of mass storage devices 306 may include hard discs, optical disks, magneto-optical discs, solid-state storage devices, and/or a variety other mass storage devices known in the art. The communication module 308 is operable to communicate information with the other components in the system 200 (e.g., through a network or directly with a communication module of other components). For example, an information handling system 300 used in the layout processing system 216 may communicate the scanning parameter 218 with the scanning system 220. The communication module 308 is also operable to communicate information such as process parameters with other components of an IC manufacturing systems such as photomask fabrication systems and lithography tools. Exemplary lithography tools include steppers, scanners, immersion lithography tools, e-beam writers, and the like. The communication module 308 is also operable to receive user input into the information handling system 300. For example, an information handling system 300 used in the alignment system 224 may receive and/or store user input on alignment criteria. In an embodiment, each of the information handling systems 300 include software instructions for performing the operations discussed below with reference to FIGS. 1 and 2.

Referring now to FIGS. 1 and 2, the method 100 begins by performing physical design of an integrated circuit (IC) using an electronic design system 202 as shown in block 102. In some examples, the physical design may include transistors, interconnects, LED, MEMS, printed circuit boards (PCB), or other suitable devices. During the physical design, the features (e.g., devices and interconnections thereto) of the circuit design are converted into a geometric representation of shapes, typically called a design layout 204. The physical design of block 102 may include a number of steps such as, developing a netlist; floor planning; partitioning; clock tree synthesis; placement; routing; timing closure steps; verification steps such as layout-versus-schematic (LVS), design rule checking (DRC); design for manufacturability (DFM) steps; and/or other suitable processes. The physical design of block 102 may use a library such as a standard cell library, use fully-custom design, use semi-custom design, and/or use other design methodologies.

During block 102, a design layout 204 is generated. The design layout 204 may be in various file formats and defines the design of, for example, the integrated circuit. In some embodiments, the design layout is in a GDS (e.g., GDSII) file format. In some embodiments, the design layout 204 is in an OASIS file format. In some embodiments, the design layout 204 is in a DFII file format. The design layout 204 however may be in other formats, now known or later developed. The design layout 204 provides a plurality of main features, features that are to be formed on layer(s) on a semiconductor substrate when fabricating the semiconductor device. The main features may be include, for example, gate features, source/drain features, capacitor plates, diffusion regions, conductive lines, vias, contacts, and/or various other semiconductor features including features typical of devices formed using complementary metal oxide semiconductor (CMOS) processes.

Figure 4:
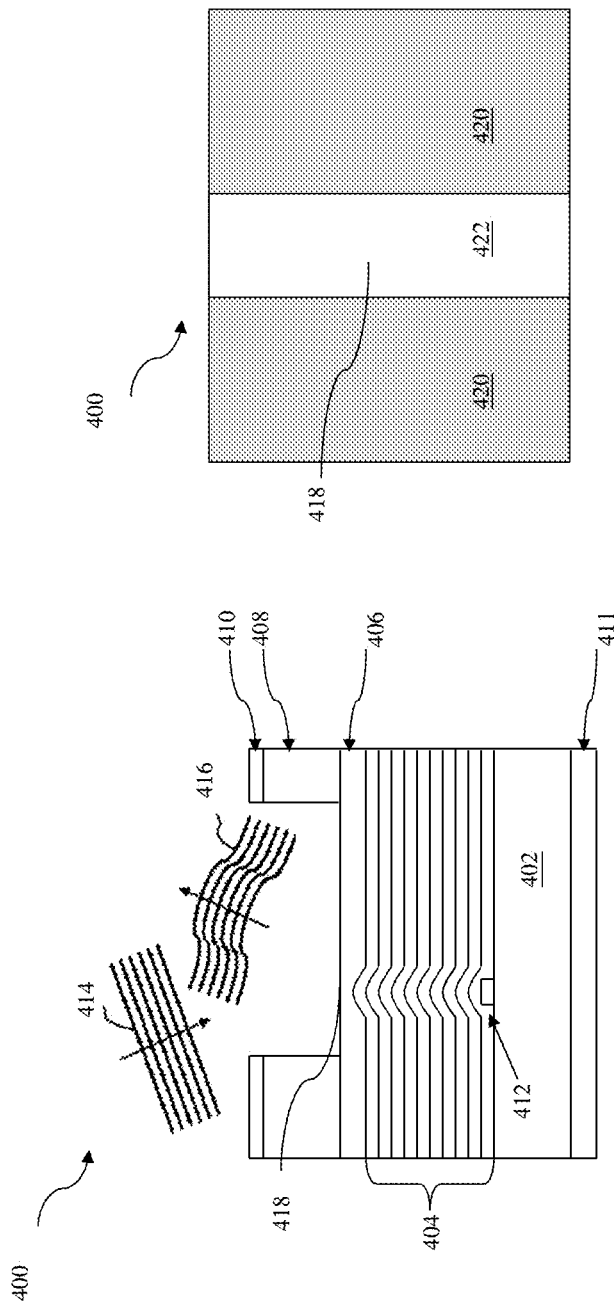
FIG. 4A is a cross-sectional view of a mask according to one or more aspects of the present disclosure.
FIG. 4B is a top view of a mask according to one or more aspects of the present disclosure.

Referring now to FIGS. 1, 2, and 4, the method 100 then proceeds to block 104, where a mask is fabricated. Referring to FIG. 2, a mask writer 206 may be used to form a geometric pattern corresponding to the design layout 204 output from the electronic design system 202, and fabricate a mask 208. In an embodiment, the mask writer 206 includes an e-beam mask writer. Some exemplary e-beam writers include multi-beam e-beam writers, variable shaped beam writers, Gaussian beam, character projection, and/or other suitable e-beam writer tools. In some embodiments, the mask writer 206 may be a laser writer. The mask writer 206, such as an e-beam writer, projects one or more beams of electrons through a stencil onto a mask (blank having a photosensitive layer) to form a mask image reflecting the patterns on the design layout 204.

The mask 208 fabricated in block 104 may include a substrate upon which patterns are etched and/or materials disposed thereon are patterned to reflect the design layout 204. The mask 208 may be a binary mask, a phase shift mask (PSM), an extreme ultraviolet lithograph (EUVL) mask, and/or other suitable mask. In an embodiment, the mask 208 includes transparent substrate (e.g., quartz) and an opaque material (e.g., chromium). Exemplary PSM may include attenuated PSM, alternating PMS, and/or other phase shift mask technologies. Various other mask technologies now known or later developed may also benefit from aspects of the present disclosure.

Referring now to FIGS. 4A and 4B, an exemplary EUVL mask 400 fabricated in block 104 is illustrated. In some embodiments, the EUVL mask 400 may be used as the mask 208 of FIG. 2. In some embodiments, the EUVL mask 400 includes a low thermal expansion material (LTEM) mask substrate 402, a reflective multilayer (ML) 404, a buffer layer 406, an absorber layer 408 and a protection layer 410. In addition, a conductive layer 411 may be deposited on a backside of the LTEM mask substrate 402 for electrostatic chucking purposes. In the EUVL mask 400 shown in FIGS. 4A and 4B, the absorber layer 408 is patterned according to the design layout 204. When an incident EUV radiation is projected onto the EUVL mask 400, the patterned absorber layer 408 absorbs the EUV radiation while the ML 404 reflects the EUV radiation, thereby forming a patterned EUV radiation, which may be used to pattern a substrate. As shown in the FIG. 4B, the EUVL mask 400 includes absorptive areas 420 corresponding to the patterned absorber layer 408 and a reflective area 422 corresponding to the exposed ML 404.

In some embodiments, defects in the ML 404 may distort the patterned EUV radiation, and affect print fidelity and result in severe pattern distortion on a substrate. In the example illustrated in FIG. 4A, an input beam 414 is reflected from the ML 404 to form a reflected beam 416. An EUV phase defect 412 located near the lower portion of the ML 404 may cause a phase shift in the reflected beam 416, and introduce errors in the pattern transferred to a substrate using the EUVL mask 400. In some embodiments, the top surface 418 above the EUV phase defect 412 is substantially flat, which makes it difficult to detect the EUV phase defect 412, for example, by inspecting the surface of the EUVL mask 400.

Figure 5:
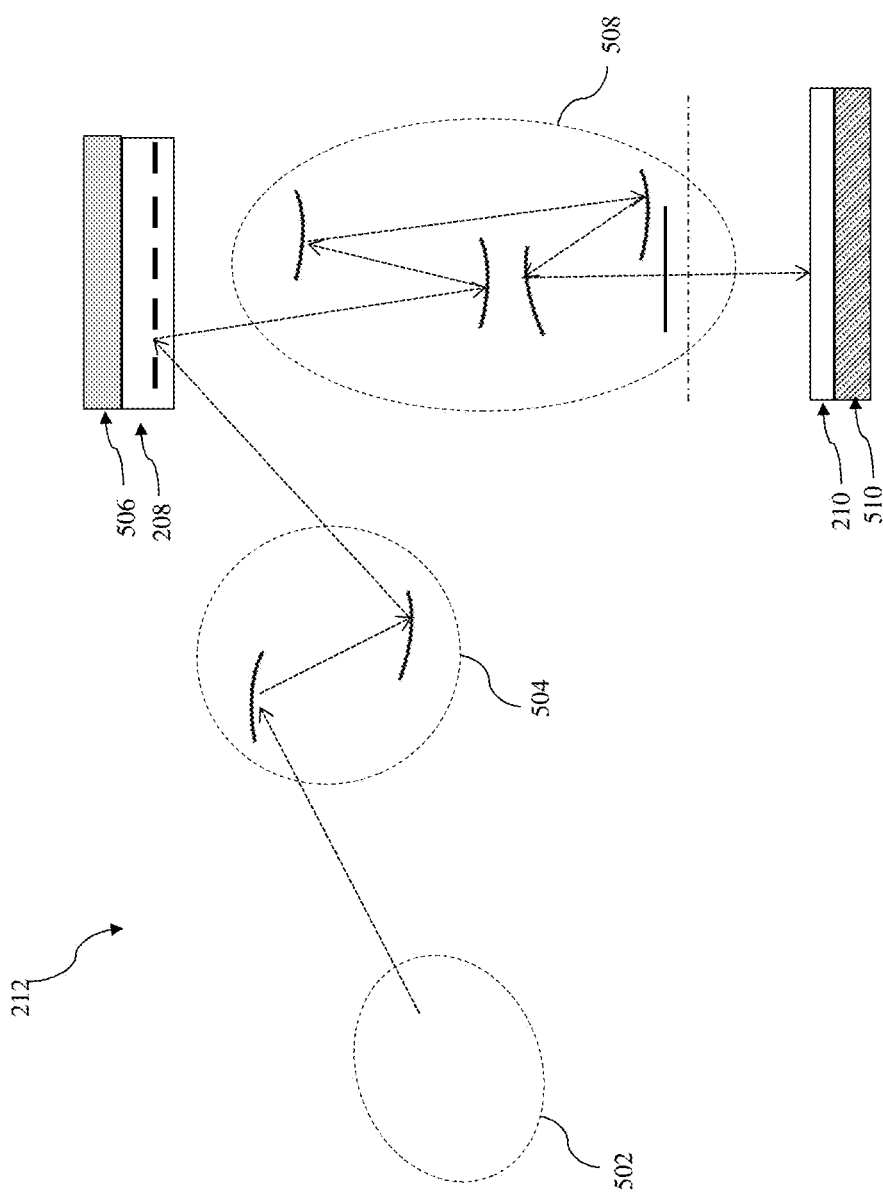
FIG. 5 illustrates a diagram of an imaging system according to one or more aspects of the present disclosure.

Referring now to FIGS. 1, 2, and 5, after various processing steps, the completed mask may then be used in an optical lithography imaging system, as illustrated in block 106 of the method 100. Referring now to FIG. 2, an imaging system 212 may receive a mask 208 and a substrate 210, perform a lithography process to the substrate 210 using the mask 208, and generate an imaged substrate 210. One example of an imaging system 212 is provided in FIG. 5. The imaging system 212 of FIG. 5 includes a plurality of subsystems such as a radiation source 502, an illuminator 504, a mask stage 506 configured to receive a mask 208, projection optics 508, and a substrate stage 510 configured to receive a semiconductor substrate 210. The imaging system 212 exposes a photosensitive material (e.g., a photoresist layer) coated on the semiconductor substrate 210, such as a silicon wafer. The IC design pattern defined on the mask 208 is imaged to the photoresist layer to form a latent patent. The semiconductor substrate 210 may be any suitable elementary semiconductor, compound semiconductor, alloy semiconductor. The target substrate 210, along with the photoresist layer, may further include various features used for fabricating semiconductor devices such as, for example, various doped regions, dielectric features, conductive features including multi-level interconnects, gate features, and the like. These materials and processes are typical of CMOS process technology and thus, not described in detail herein.

In some embodiments, at block 106, the exposed substrate 210 is processed in additional steps such as development and baking to create a pattern on the substrate. For example, the patterning of the photoresist layer may further include developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process. In some embodiments, at block 106, the substrate 210 may be further processed in additional steps such as etching, metal deposition, and chemical mechanical polishing (CMP). Again, these materials and processes can use those of CMOS process technology and thus, not described in detail herein.

In some embodiments, at block 106, the dies on the wafer 210 may undergo the same or different process conditions, e.g., lithography exposure conditions, etching conditions, metal deposition conditions, and CMP conditions. In some examples, the applied lithography exposure conditions may be inside and outside process windows. In some embodiments, the dies on the wafer 210 may undergo different lithography exposure conditions (e.g., controlled by using a focus exposure matrix (FEM) method and/or a focus/dose perturbation process).

Figure 6:
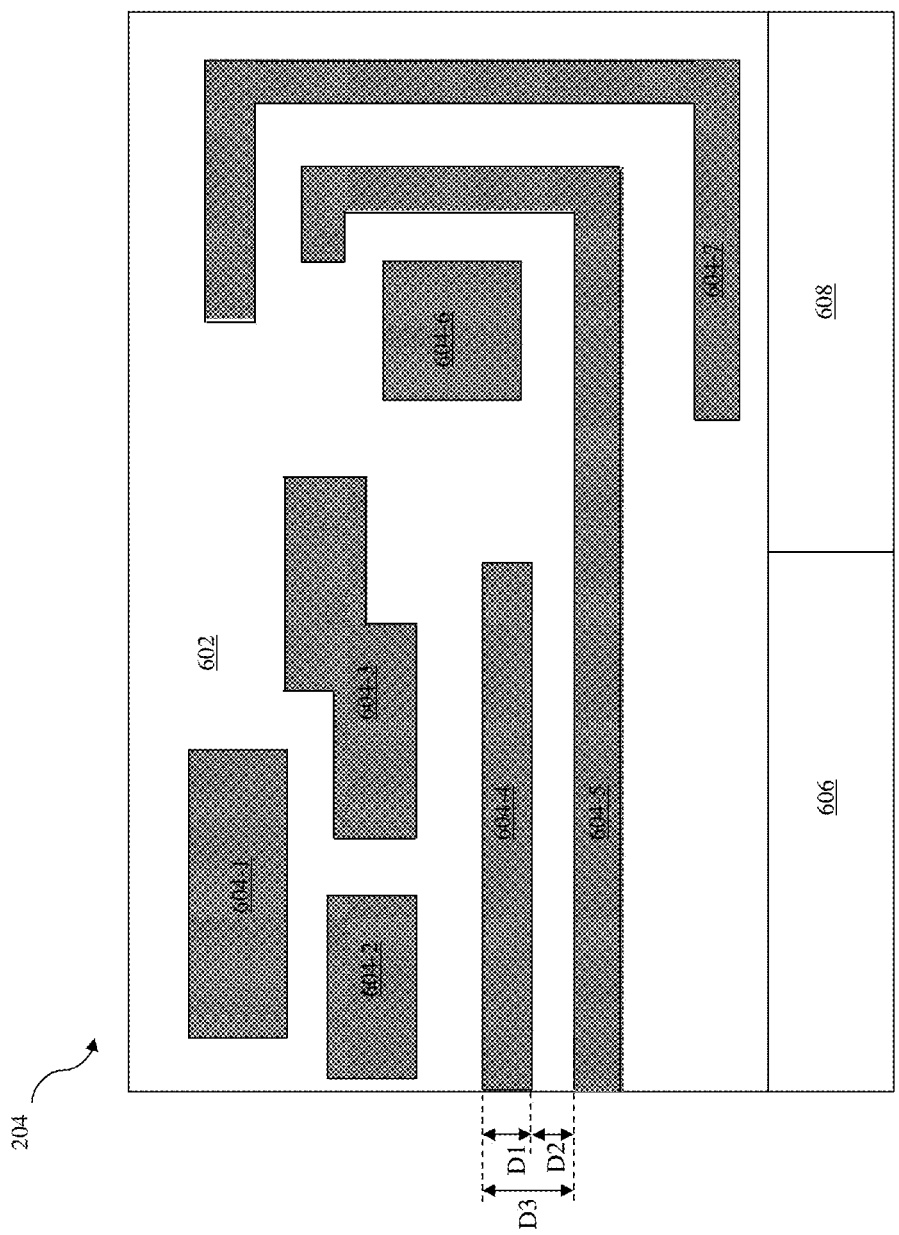
FIG. 6 illustrates a design layout of a semiconductor device according to one or more aspects of the present disclosure.

Referring now to FIGS. 1, 2, and 6, the method 100 then proceeds to block 108, where a scanning parameter is determined based on the design layout. Referring now to FIG. 2, the layout processing system 216 receives the design layout 204 and determines a scanning parameter 218. The scanning parameter 218 may be used to control the subsequent scanning process, and may include operating parameters of a scanning system used in the subsequent scanning process. Some exemplary scanning parameters include a pixel size, contrast, scan speed, a probe current, and a probe diameter of a Scanning Electron Microscope (SEM).

In some embodiments, the layout processing system 216 may calculate various geometric parameters of the design layout 204, and determine the scanning parameter 218 based on the geometric parameters of the design layout 204. Some exemplary geometric parameters include a pattern density, a pitch size, a pitch number, lengths, widths, diameters, curvatures, cross angles, and overlay mismatch.

Referring now to FIG. 6, an exemplary design layout 204 provided by the layout processing system 216 is illustrated. In some embodiments, a design layout 204 may include various areas including areas 602, 606, and 608. In some embodiments, the area 602 is a circuit area. In some embodiments, the area 606 is a dummy area. In some embodiments, the area 608 is a cell area (e.g., including Static Random Access Memory (SRAM) arrays). In some embodiments, defects in areas corresponding to the circuit area 602 may be yield-impacting, while defects in the dummy area 606 and/or the cell area 608 may not affect yield, and may be referred to as nuisance defects that may be filtered. In some examples, a dummy area is an area without any functional circuit that is used to balance, adjust, and/or compensate loading effect of various processes (e.g., lithography, etch, CMP) caused by non-uniform pattern density within a chip. In the example of FIG. 6, the layout processing system may identify that the area 602 (which may also be referred to as design layout 602) includes layout polygons 604-1, 604-2, 604-3, 604-4, 604-5, 604-6, and 605-7. In some embodiments, a layout polygon may correspond to a feature of a semiconductor device.

In some embodiments, the area 602 may have a minimum feature size D1, and a minimum spacing size D2 extending between two features. A pitch size D3 of the design layout 204 is the sum of the minimum feature size D1 and the minimum spacing size D2. In some examples, the minimum feature size D1 is about 20 nm, the minimum spacing size D2 is about 24 nm, and the pitch size D3 is about 44 nm.

In some embodiments, the layout processing system 216 determines the scanning parameter 218 based on the various geometric parameters of the design layout 204 and/or a detection sensitivity requirement. In some embodiments, the scanning parameter 218 may include a pixel size, contrast, scan speed, a probe current, and/or a probe diameter, which may be used in controlling a subsequent scanning process.

In some embodiments, the pixel size of the scanning parameter 218 may be determined based on the geometric parameters of the design layout. In some embodiments, the determined pixel size is about one fourth of the pitch size D3. For example, the determined pixel size may be about 11 nm where the pitch size D3 is about 44 nm. In some embodiments, the determined pixel size is about half the minimum feature size D1. For example, the determined pixel size may be about 10 nm where the minimum feature size D1 is about 20 nm. In some embodiments, using a larger pixel size may reduce the required scan time. For examples, the scan time required for a 5 mm by 6 mm substrate area in a subsequent scanning process is about six days using a determined pixel size of 10 nm, and is reduced to about five days using a determined pixel size of 11 nm. In some embodiments, the pixel size is determined based on minimum pitch size D3, minimum feature size D1, minimum spacing size D2, and/or a combination thereof. In an example, the pixel size (e.g., 10 nm) is less than one fourth of the minimum pitch size D3 (e.g., 44 nm), less than one half of the minimum feature size D1 (e.g., 20 nm), and less than one half of the minimum spacing size D2 (e.g., 24 nm).

In some embodiments, the pixel size of the scanning parameter 218 may also be determined based on a detection sensitivity requirement. Because the subsequent scanning process is time-consuming, it is important to provide a pixel size that satisfies both a scan time (and throughput) requirement and a detection sensitivity requirement. There is a reciprocal relationship between the pixel size and the required scan time. For example, while using a smaller pixel size may increase the pixel count per unit area in the resulting image and increase detection sensitivity, the required scan time is increased. Therefore, in some embodiments, the layout processing system 216 may choose the largest pixel size that may satisfy the required detection sensitivity as the determined pixel size. For example, the detection sensitivity requirement may require capturing defects having a defect size no less than a threshold defect size (e.g., provided by a user). In some examples, the threshold defect size may be the minimum feature size D1 or half the pitch size D3. In some embodiments, the pixel size may be determined based on the threshold defect size. In some examples, the determined pixel size may be about half the threshold defect size.

Figure 7:
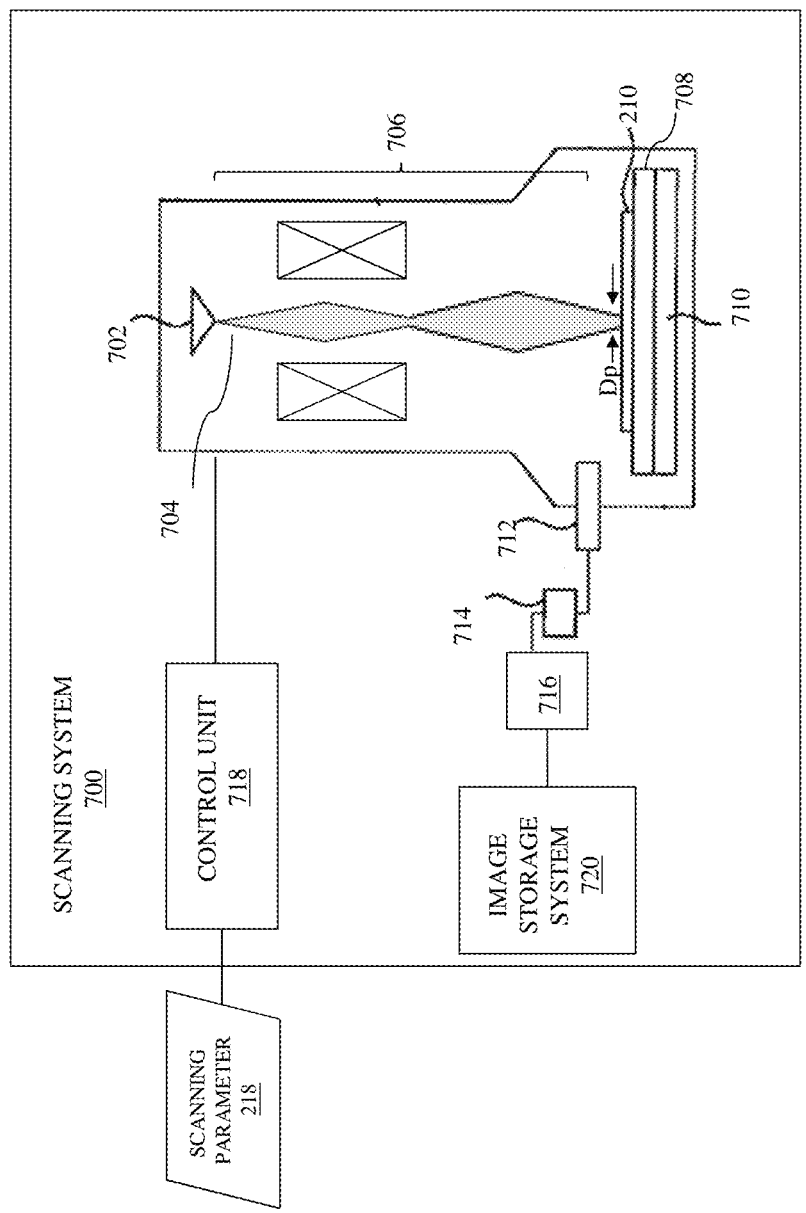
FIG. 7 illustrates a diagram of a scanning system according to one or more aspects of the present disclosure.

Referring now to FIGS. 1, 2, and 7, the method 100 then proceeds to block 110, where the imaged substrate is scanned by a scanning system using the determined scanning parameter to generate a substrate image. Referring to the example of FIG. 2, a scanning system 220 receives the imaged substrate 210, receives the scanning parameter 218 (e.g., from the design layout processing system 216), and performs a scanning process on the imaged substrate 210 using the scanning parameter 218. After the scanning process is performed, the scanning system 220 may generate a substrate image 222.

In some embodiments, at block 110, the entire substrate 210 may be scanned. In some embodiments, only selected areas of the substrate 210 may be scanned. For example, the scanning system 220 may determine to scan an area of the substrate 210 corresponding to the circuit area 602 of the design layout 204 to capture yield-impacting defects. For further example, the scanning system 220 may determine not to scan the areas of the substrate corresponding to the area 606 and/or the area 608 of the design layout 204 to reduce nuisance defect detection.

In some embodiments, the scanning system 220 may be an e-beam inspection tool system, Critical Dimension Scanning Electron Microscope (CD SEM) system, or some other scanning system capable of discerning individual features on the imaged substrate 210.

Referring now to FIG. 7, illustrated is an exemplary SEM system 700 which may be used as the scanning system 220 of FIG. 2. In the SEM system 700, an electron beam 704 emitted from an electron source 702 is made to converge in an electron optical system 706 to scan the electron beam 704 on an imaged substrate 210 disposed on a mount 708 supported by a stage 710. The stage 710 may be moved in horizontal directions as well as vertically including tilting at an angle for positioning the mount 708.

In some embodiments, the imaged substrate 210 is irradiated with the electron beam 704. The final electron beam 704 at the surface of the imaged substrate 210 may have a probe diameter (spot size) Dp. Secondary charged particles such as secondary electrons or reflected electrons generated from the imaged substrate 210 as a result of the irradiation are detected by a detector 712 to generate an SEM image of the imaged substrate 210. In some embodiments, the detector 712 may be connected to an A/D converter 714, and an analog output signal from the detector 712 is converted into a digital signal by the A/D converter 714. In some embodiments, a signal processor 716 may process input signals from the detector 712 and/or the A/D converter 714, generate and save a substrate image 222 in the image storage system 720.

In some embodiments, a control unit 718 may receive the scanning parameter 218 (e.g., provided by the layout processing system 216 of FIG. 2), and control the scanning conditions (e.g., the probe diameter Dp, the scanning speed, the movement of the stage 710, and/or other scanning conditions known in the art) of the SEM 700 according to the scanning parameter 218. In some embodiments, the scanning parameter 218 may include a determined pixel size, which may be the size of an area on the imaged substrate 210 from which an image signal is collected.

As discussed above with reference to block 108, in some embodiments, the determined pixel size of the scanning parameter 218 may affect the scanning time. In some examples, by using the largest pixel size that may satisfy the detection sensitivity requirement for defects, the scanning time may be reduced significantly.

Figure 8:
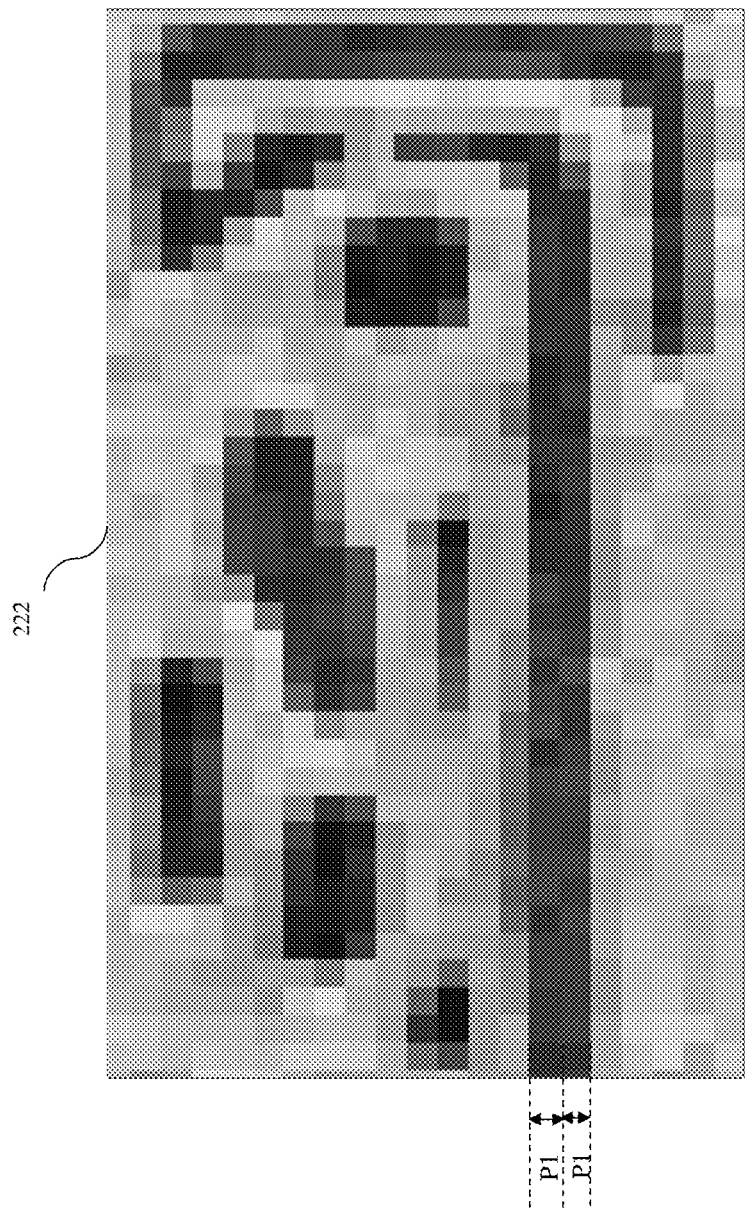
FIG. 8 illustrates a substrate image according to one or more aspects of the present disclosure.

Referring to the example of FIG. 8, illustrated is an SEM image 222 (also referred to as the substrate image 222) generated by the SEM system 700. The SEM image 222 is an image of a portion of the imaged substrate 210 corresponding to the area 602 of the design layout 204. In some embodiments, the SEM image 222 is a gray scale image, where edges of the features may have a light gray outline indicating a change of heights on the surface of the patterned substrate. In some embodiments, the SEM image 222 has a pixel size P1 (e.g., 10 nm) equal to about the determined pixel size (e.g., 10 nm) of the scanning parameter 218 received by the control unit 718.

Referring now to FIGS. 1, 2, 9A, 9B, 9C, 9D, 9E, 9F, 9G, and 9H, the method 100 then proceeds to block 112, where contours of the substrate image are extracted. Referring to FIG. 2, the image processing system 226 receives the substrate image 222 from the scanning system 220, extracts the contours of the substrate image, and generates a substrate contour image 228. As illustrated in FIG. 8, in some embodiments, the contour extraction is challenging because of various issues with the substrate contour image 228. In some examples, the substrate image 222 has a low resolution (e.g., with a pixel size greater than about 7 nm), and a minimum feature may be covered by only a few pixels (e.g., two or three pixels). In some examples, the substrate image 222 has uneven brightness in some corners and/or various distortions near the borders. In some examples, different substrate images 222 have different brightness distributions, distortions, and/or patterns (e.g., with various densities and/or feature widths), which vary randomly among those substrate images 222, and are hard to correct. As described in detail below, various imaging processing techniques may be used to address these challenges and extract contours accurately.

Figure 9A:
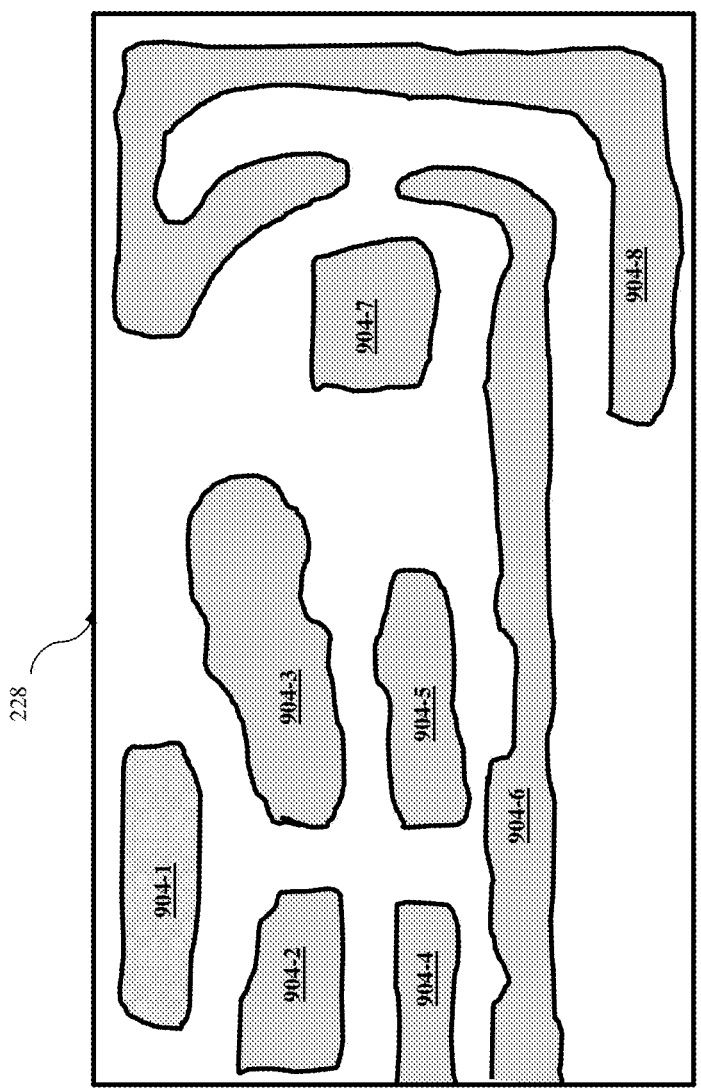
FIG. 9A illustrates a substrate contour image according to one or more aspects of the present disclosure.

Referring to FIG. 9A, illustrated is an exemplary substrate contour image 228 (also referred to as a contour image 228) generated by the image processing system 226 using a substrate image 222 of FIG. 8. The contour image 228 may include contours in the substrate image 222. The image processing system 226 may derive closed curves from the substrate contour image 228. In the example of FIG. 9A, the contour image 228 includes closed curves 904-1, 904-2, 904-3, 904-4, 904-5, 904-6, 904-7, and 904-8.

Figure 9B:
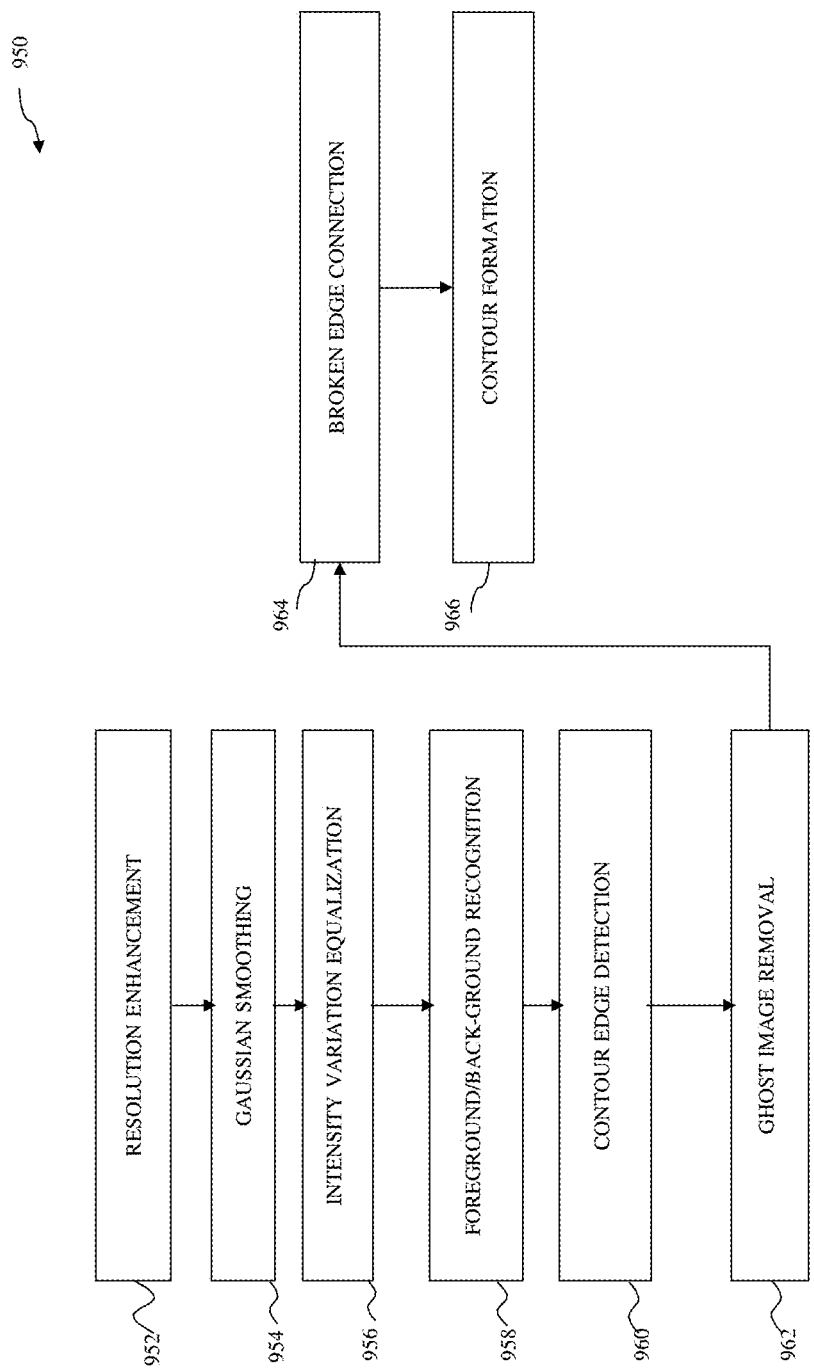
FIG. 9B is a flow chart of an embodiment of a method of extracting a substrate contour image from the substrate image according to one or more aspects of the present disclosure.

Referring to the example of FIG. 9B, illustrated is a method 950 that may be used by the image processing system 226 to extract the contour image 228 from the substrate image 222. The method 950 begins at block 952, where a resolution enhancement is performed to the substrate image 222. For example, an optimized pixel size (also referred to as an effective pixel size) of the substrate image 222 may be calculated (e.g., based on local intensity variances). The optimized pixel size (e.g., about 7 nm) may be less than the pixel size (e.g., about 10 nm) of the substrate image 222, thus improving the accuracy of the contour extract. The method 950 then proceeds to block 954, where a Gaussian smoothing is applied to the substrate image 222, which may reduce the noise in the substrate image 222. The method 950 then proceeds to block 956, where an intensity variation equalization is applied to the substrate image 222 to equalize intensity and contrast variations and obtain adaptive histograms. For example, differences in the grey-level distribution among sub-regions of the substrate image 222 are normalized to reduce the variation among those sub-regions. The method 950 then proceeds to block 958, where foreground and background areas are identified. In some examples, for a particular pixel, a comparison of the grey-level of the particular pixel and the grey levels of its neighboring pixels is performed to determine whether the particular pixel is a foreground pixel or a background pixel. Foreground areas are determined by analyzing the foreground pixels, and background areas are determined by analyzing the background pixels. In some examples, the determined foreground areas and background areas are expanded into undetermined areas by examining properties of the local and neighboring pixels.

The method 950 then proceeds to block 960, where a contour edge detection is performed. In some examples, a boundary between the foreground pixels and the background pixels is detected. In some examples, a modified Canny algorithm is used to detect contour edges and further expand the determined foreground areas and background areas. The modified Canny algorithm includes an initial edge detection which detects edges using noise reduction, intensity gradient, non-maximum suppression (e.g., edge thinning), and Hysteresis. In some examples, two threshold values, a high threshold value and a low threshold value, are set to clarify the different types of edge pixels. If an edge pixel's gradient value is higher than the high threshold value, they are marked as strong edge pixels. If the edge pixel's gradient value is smaller than the high threshold value and larger than the low threshold value, they are marked as weak edge pixels. If the gradient value of the pixel is smaller than the low threshold value, the pixel is suppressed. In some embodiments, the low threshold value may be adjusted (e.g., by using a smaller low threshold value) to detect more edge pixels. An edge is formed by connecting a group of edge pixels, and has two end points, each of the edge points representing an edge pixel. Edges are then connected or discarded to help the formation of close curves. For example, Hough transform is used to connect edges, identify long lines (e.g., along different directions), and reduce broken edges.

The method 950 then proceeds to block 962, where ghost image analysis and removal are performed. The image processing system 226 may define one or more ghost image criteria (e.g., irregular shapes, and/or large size pixel clusters). Contours detected from pixels that satisfy the one or more ghost image criteria are removed from the substrate image 222.

Figure 9C:
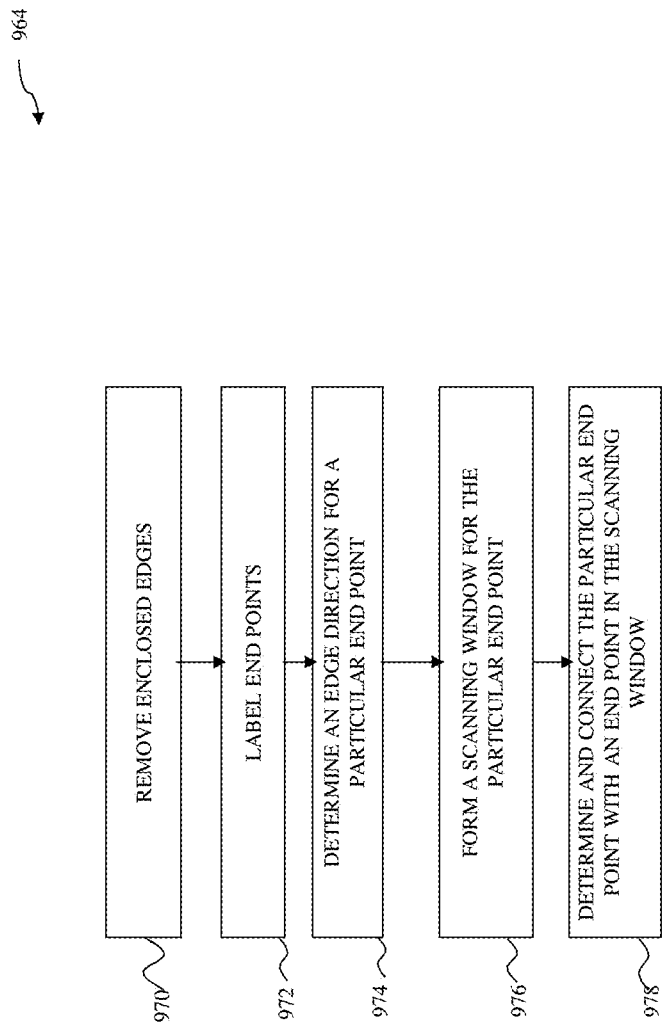
FIG. 9C is a flow chart of an embodiment of a method of connecting edges according to one or more aspects of the present disclosure.
Figure 9D:
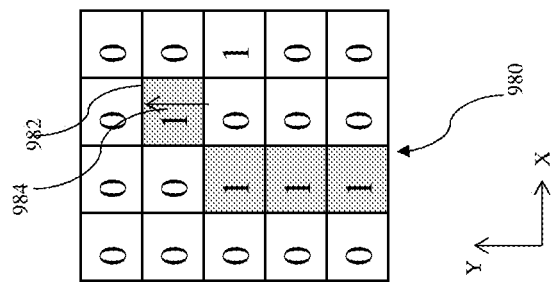
FIGS. 9D, 9E, 9F, 9G, and 9H are diagrams illustrating various processes extracting a substrate contour image from the substrate image according to one or more aspects of the present disclosure.

The method 950 then proceeds to block 964, where additional edge connections are performed. Possible connections between open end points of various edges are analyzed, and some open end points may be connected. Referring to FIG. 9C, illustrated therein is a flowchart of an example of a method of block 964, where the method of block 964 begins at block 970 to remove enclosed edges. For example, edges located within an identified closed curve are removed. The method of block 964 then proceeds to block 972, where two end points of each edge are labeled the same. The method of block 964 then proceeds to block 974, where an edge direction is determined for each end point of a particular, for example, based on the neighboring edge pixels of the particular edge. Referring to the example of FIG. 9D, the end point 982 of the edge 980 has an edge direction 984 in the X direction.

Figure 9E:
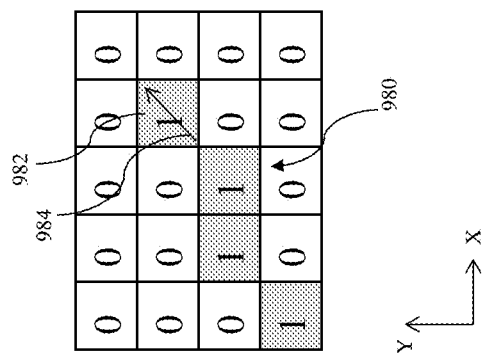
Figure 9F:
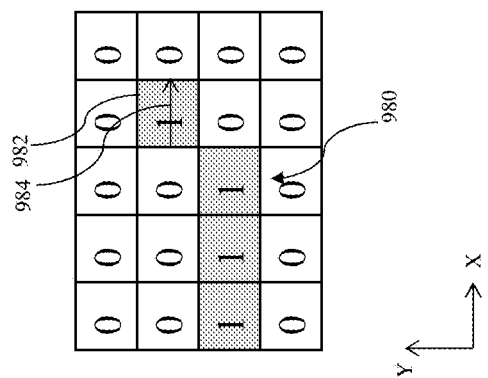
Figure 9H:
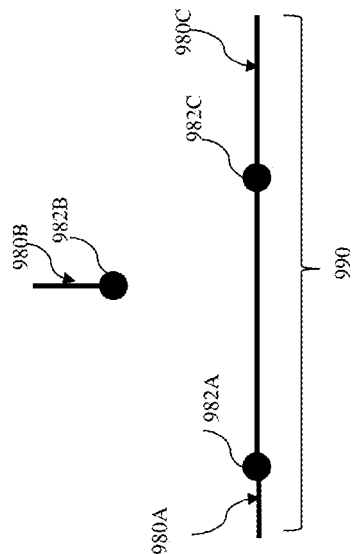
Figure 9G:
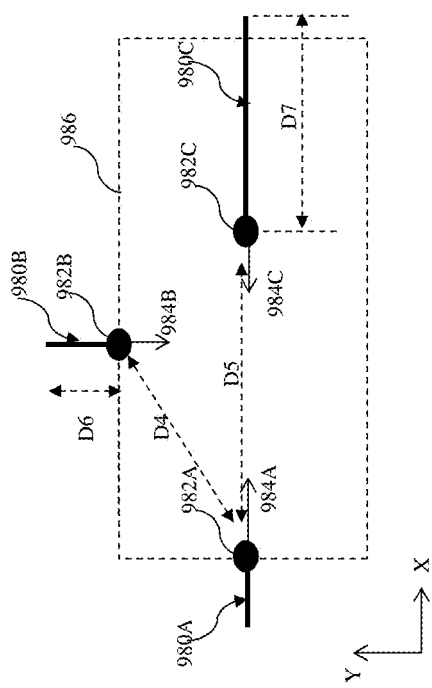

Referring to the example of FIG. 9E, the end point 982 of the edge 980 has an edge direction 984 at 45 degrees to the X direction. Referring to the example of FIG. 9F, the end point 982 of the edge 980 has an edge direction 984 in the Y direction. The method of block 964 then proceeds to block 976, where a scanning window is formed for each end point. Referring to the example of FIG. 9G, an end point 982A of the edge 980A has an edge direction 984A in the X direction. A scanning window 986 may be formed extending from the end point 982A in the X direction (or in a direction different from the edge direction 984A). The scanning window 986 may have a shape elongated in the edge direction (e.g., a rectangular shape, an oval shape), or may have a circle or square shape. The size of the scanning window 986 (e.g., three pixels along the X direction and two pixels along the Y direction) may be determined based on various properties of the substrate image 228 (e.g., pixel size) and/or the layout 204 (e.g., minimum feature size D1, minimum spacing size D2, minimum pitch size D3). As illustrated in the example of FIG. 9G, an end point 982B of an edge 980B and an end point 982C of an edge 980C are located within the scanning window 986. For each of the end points 982B and 982C, a connection possibility score is calculated, for example, based on a length of the corresponding edge (e.g., a length D6 for the edge 980B, a length D7 for the edge 980C), a distance between the corresponding end point (e.g., a distance D4 between the end point 982A and the end point 982B, a distance D5 between the end point 982A and the end point 982C), and/or an edge direction of the corresponding end point (e.g., the edge direction 984B, the edge direction 984C). In an example, the possible connection between the end points 982A and 982C has a connection possibility score that is higher than a connection possibility score of the possible connection between the endpoints 982A and 982B. Referring to FIG. 9H, after it is determined that the end points 982A and 982C has a connection possibility score higher than the other possible connections between the end point 982 and other end points in the scanning window 986, the endpoints 982A and 982C are connected to form an edge 990 which includes the edge 980A, the edge 980C, and the connection between end points 982A and 982C.

The method 950 then proceeds to block 966, where contours (e.g., closed curves 904-1, 904-2, . . . , 904-8) are formed from the contour image 228, for example, by vectorizing the contour image 228.

Referring now to FIGS. 1, 2, 10A, and 10B, the method 100 then proceeds to block 114, where a segmental alignment process is performed to align the substrate contour image with the design layout. Referring now to FIG. 2, the alignment system 224 receives the design layout 204 (e.g., from the design layout processing system 216), receives the substrate contour image 228 (e.g., from the image processing system 228), and aligns the substrate contour image 228 with the design layout 204.

Figures 10A, 10B:
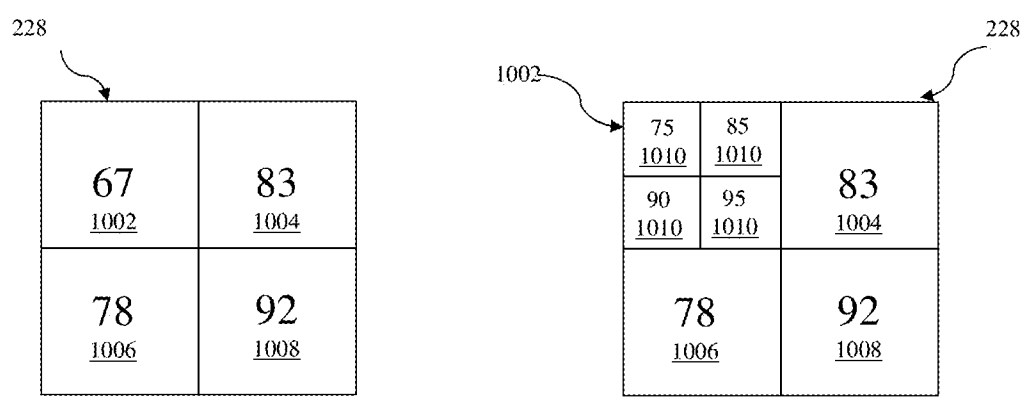

Referring now to FIGS. 10A and 10B, in some embodiments, the segmental alignment process may be performed by the alignment system 224 to align the substrate contour image 228 and the design layout 204. In some examples, the segmental alignment process may include one or more alignment steps. Referring to FIG. 10A, the alignment system 224 may segment the substrate contour image 228 into regions 1002, 1004, 1006, and 1008. In some embodiments, the alignment system 224 may perform a first alignment step to align each region with the design layout 204. For example, a bit map representation of a particular region of the substrate contour image (and/or the corresponding region of the substrate image 222) may be used to align with a bit map representation of the design layout 204. For further example, the alignment system 222 may align the substrate contour image 228 with the design layout 204 by pattern matching, which may include matching each vector of the substrate contour image 228 with each vector of the design layout 204. In some embodiments, an alignment score may be assigned to each region after the first alignment step is performed. For example, an alignment score may be determined based on the correspondence between the two bit map representations. For further example, the alignment score may be determined by the number of matching vectors. In some embodiments, a higher alignment score may indicate better alignment.

In some embodiments, the alignment system 224 may use alignment criteria (e.g., received from an operator or retrieved from a storage medium of the alignment system 224) to determine whether a region has been properly aligned. For example, in the example of FIGS. 10A and 10B, the alignment system 224's alignment criteria require that the alignment score is greater than 70. As illustrated in FIG. 10A, in some embodiments, after performing the first alignment step, the regions 1002, 1004, 1006, and 1008 of the substrate contour image 228 have alignment scores 67, 83, 78, and 92 respectively. The alignment system 224 may apply the alignment criteria, and determine that the region 1002 is not properly aligned. By using the segmental alignment process, the impact of the image distortion introduced by the SEM scanning is reduced.

As shown in FIG. 10B, in some embodiments, the alignment system 224 may segment the region 1002 into four regions 1010 and perform a second alignment step on each of the four regions 1010. In the example of FIG. 10B, after the second alignment step for each of the four regions 1010 is performed, each of the regions 1004, 1006, 1008, and 1010 of the substrate contour image 228 has an alignment score greater than 70. The alignment system 224 may then determines that the substrate contour image 228 is properly aligned. In some embodiments, the alignment system 224 may provide the aligned substrate contour image 228 and the design layout 204 to a defect detection system 230.

Figure 11:
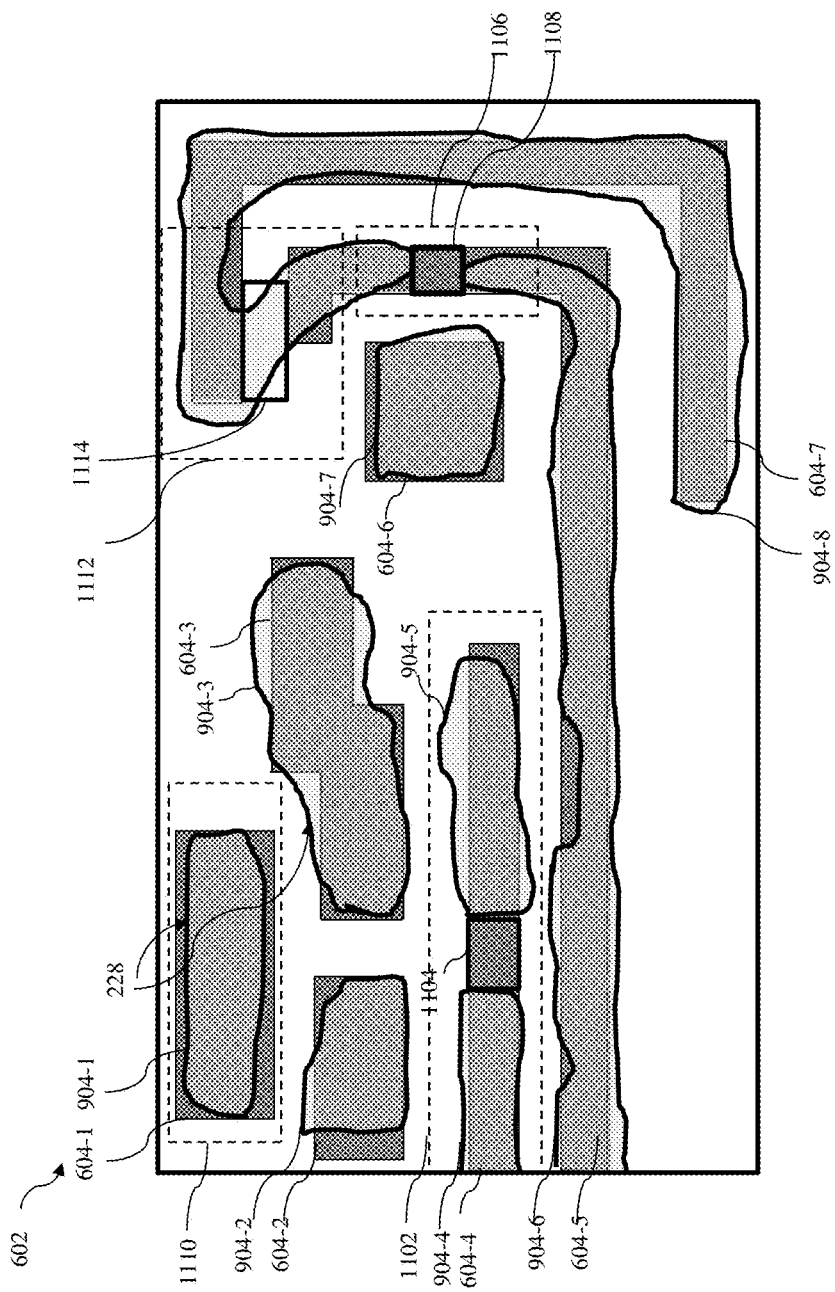
FIG. 11 illustrates a substrate contour image overlaid on a corresponding design layout according to one or more aspects of the present disclosure.

Referring now to FIGS. 1, 2, and 11, the method 100 then proceeds to block 116, where a defect of the substrate may be identified by comparing the number of closed curves in a region of the substrate contour image and the number of layout polygons in a corresponding region of the design layout.

Referring to FIG. 2, the defect detection system 230 may receive the aligned substrate contour image 228 and the design layout 204 from the alignment system 224, and identify a defect of the substrate 210 by comparing the number of closed curves in the substrate contour image 228 and the number of layout polygons in the corresponding design layout 204.

Referring now to FIG. 11, illustrated is a substrate contour image 228 stacked over the corresponding area 602 of the design layout 204. In some embodiments, the defect detection system 230 may identify an inspection area 1102, which includes a substrate contour image area of the substrate contour image 228, and a corresponding layout area of the layout 602. The defect detection system 230 may then calculate the number of substrate closed curves and the number of layout polygons in the inspection area 1102. In some embodiments, if both numbers are greater than one, the defect detection system 230 may gradually reduce the inspection area 1102 until the inspection area 1102 includes either a single layout polygon or a single substrate closed curve. In some examples, by including either a single layout polygon or a single substrate closed curve in an inspection area, the location of a defect may be identified more accurately and efficiently. In some examples, to determine an interconnect open defect (broken defect), the inspection area (e.g., the area 1106) includes a single layout polygon or a portion thereof (e.g., the polygon 604-5). In some examples, to determine an interconnect bridge defect, the inspection area (e.g., the area 1112) includes a single closed curve or a portion thereof (e.g., the closed curve 904-8).

In some embodiments, the defect detection system 230 may identify an inspection area including a single layout polygon or a portion thereof. For example, as illustrated in FIG. 11, the defect detection system 230 identifies the inspection area 1102 including a single layout polygon 604-4. The defect detection system 230 then may determine that the inspection area 1102 includes two substrate closed curves 904-4 and 904-5. Because the numbers of the substrate closed curves and the layout polygons in the inspection area 1102 do not match, the defect detection system 230 may identify a defect 1104. In some embodiments, the defect 1104 may correspond to a portion of the layout polygon 604-4 disposed between the two substrate closed curves 904-4 and 904-5. In some examples, the defect 1104 may be an interconnect open defect (broken defect), where a connection on the substrate corresponding to the layout polygon 604-4 is broken.

For further example, as illustrated in FIG. 11, the defect detection system 230 may determine that the inspection area 1106 includes a portion of a single layout polygon 604-5. The defect detection system 230 then may determine that the inspection area 1106 includes portions of two or more substrate closed curves (e.g., substrate closed curves 904-6 and 904-8). Because the numbers of the substrate closed curves and the layout polygons in the inspection area 1106 are different, the defect detection system 230 may identify a defect 1108. In some embodiments, the defect 1108 may correspond to a portion of the layout polygon 604-5 disposed between the two substrate closed curves 904-6 and 904-8. In some examples, the defect 1108 may be an interconnect open defect (broken defect), where an interconnect on the substrate corresponding to the layout polygon 604-5 is broken.

For further example, the defect detection system 230 may determine that an inspection area includes a single layout polygon or a portion thereof, but does not include any substrate closed curves. The defect detection system 230 then may determine that the inspection area includes a defect. In some examples, the defect may have the same size and location as the single layout polygon or the portion thereof. In some examples, the defect may be an interconnect open defect, where an interconnect on the substrate corresponding to the single layout polygon or the portion thereof is broken.

For further example, as illustrated in FIG. 11, the defect detection system 230 may determine that the inspection area 1110 includes a single layout polygon 604-1. The defect detection system 230 then may determine that the inspection area 1110 includes a single substrate closed curve 904-1. Because the numbers of the substrate closed curves and the layout polygons in the inspection area 1110 match, the defect detection system 230 may determine that the defect inspection area 1110 does not include a defect.

In some embodiments, the defect detection system 230 may determine that an inspection area includes a single substrate closed curve or a portion thereof. For example, as illustrated in FIG. 11, the defect detection system 230 may determine that the inspection area 1112 includes a portion of a single substrate closed curve 904-8. The defect detection system 230 then may determine that the inspection area 1112 includes portions of two or more layout polygons (e.g., layout polygons 604-5 and 604-7). Based on the mismatched numbers of the substrate closed curves and the layout polygons in the inspection area 1112, the defect detection system 230 may identify a defect 1114, which may correspond to a portion of the substrate closed curve 904-8 disposed between two layout polygons 604-5 and 604-7. In some examples, the defect 1114 may be an interconnect bridge defect, which is a short between two separate interconnects on the substrate corresponding the layout polygons 604-5 and 604-7 respectively.

For further example, the defect detection system 230 may determine that an inspection area includes a single substrate closed curve or a portion thereof, but does not include any layout polygons. The defect detection system 230 then may determine that the inspection area includes a defect. In some examples, the defect may have the same size and location as the substrate closed curve or the portion thereof.

For further example, as illustrated in FIG. 11, the defect detection system 230 may determine that the inspection area 1110 includes a single substrate closed curve 904-1. The defect detection system 230 then may determine that the inspection area 1110 includes a single layout polygon 604-1. Because the numbers of the substrate closed curves and the layout polygons in the inspection area 1110 match, the defect detection system 230 may determine that the defect inspection area 1110 does not include a defect.

Figure 12:
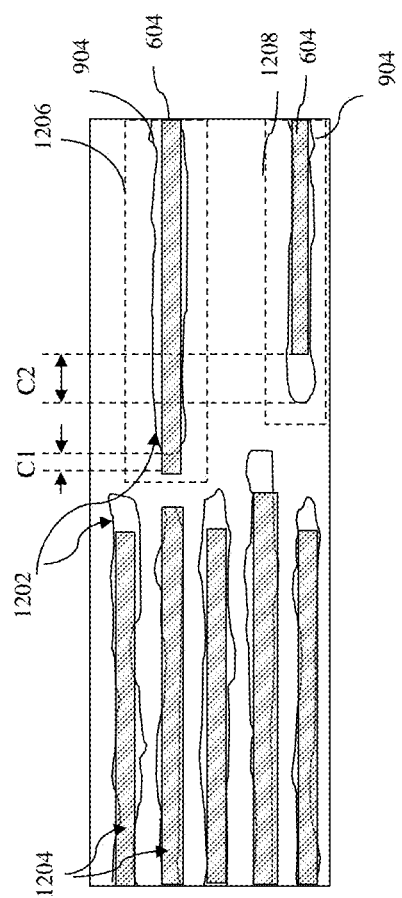
FIG. 12 illustrates a substrate contour image overlaid on a corresponding design layout according to one or more aspects of the present disclosure.
Figure 13:
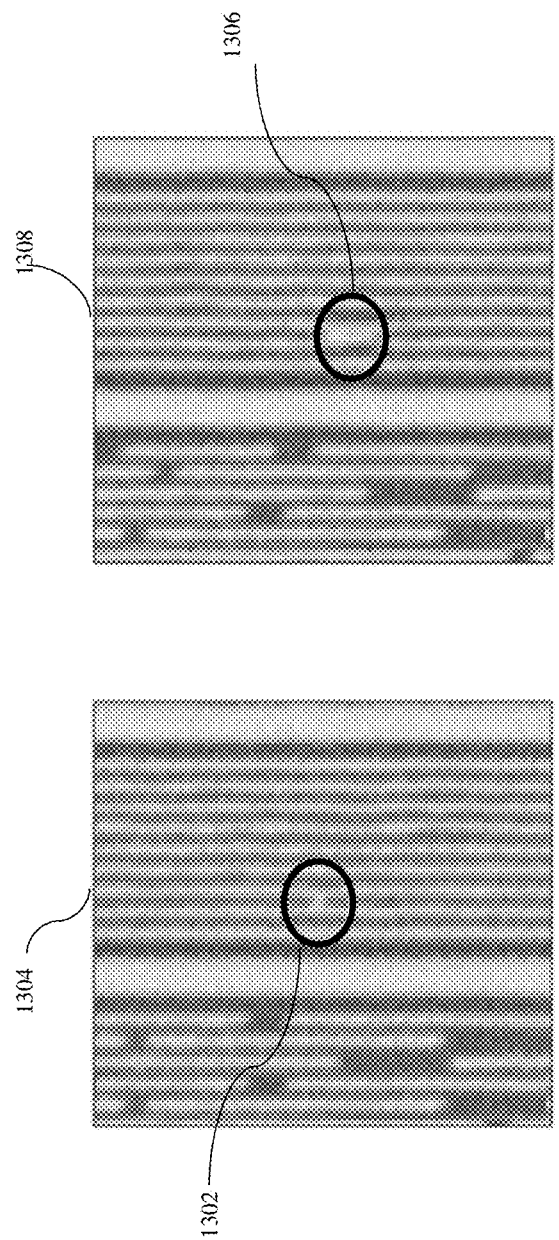
FIG. 13 illustrates substrate images of a set of dies according to one or more aspects of the present disclosure.

Referring to FIGS. 1, 2, and 12, the method 100 then proceeds to block 118, where the defect detection system 230 may remove and/or exclude nuisance defects, and keep defects of interest. Referring to the example of FIG. 12, in some embodiments, the defect detection system 230 may be able to exclude nuisance defects including critical dimension (CD) variations. In the example of FIG. 12, an exemplary substrate contour image 1202 is stacked over the corresponding region of the design layout 1204. In some embodiments, the defect detection system 230 may identify an inspection area 1204, and determines that the inspection area 1206 includes a single layout polygon 604 and a single substrate closed curve 904. The defect detection system 230 may determine that the line-end difference C1 between the layout polygon 604 and the substrate closed curve 904 of the inspection area 1206 is a CD variation, and exclude the line-end difference C1 from the detected defects. Similarly, the defect detection system 230 may determine the line-end difference C2 between the layout polygon 604 and the substrate closed curve 904 of the inspection area 1208 is a CD variation, and exclude the line-end difference C2 from the detected defects.

In some embodiments, the defect detection system 230 may include a defect knowledge database including various defect information (e.g., nuisance defect pattern information, nuisance defect location information, critical defect pattern information, critical defect location information), which may be used to analyze the detected defects (e.g., defect classification, defect source identification). In some examples, the defect information is provided by an operator. In some examples, the defect information is determined by the defect detection system 230 (e.g., by simulation using the geometric parameters of the design layout 204).

In some embodiments, the defect detection system 230 may apply a classification process to identify and remove the nuisance defects. For example, the classification process may search for nuisance defect patterns using the nuisance defect pattern information, and classify a detected defect having a nuisance defect pattern as a nuisance defect. For further example, the classification process may classify the detected defect as a nuisance defect if the location of a detected defect matches a location of the nuisance defect location information.

In some embodiments, the defect detection system 230 may apply a classification process to identify and keep critical defects. For example, the classification process may search for critical defect patterns using the critical defect pattern information, and classify a detected defect having a critical defect pattern as a critical defect. For further example, the classification process may classify the detected defect as a critical defect if the location of a detected defect matches a location of the critical defect location information.

In some embodiment, the defect detection system 230 may import defect data obtained using methods including pressurized differential scanning calorimetry (PDSC) and Lithography Compliance Check (LCC)), and detect defects using the imported defect data.

Referring to FIGS. 1, 2, 13, and 14 the method 100 then proceeds to block 120, where a repeating defect may be identified by comparing substrate defects on two substrates patterned using the same mask 208. In some embodiments, the two substrates may be two dies (e.g., from the same wafer or different wafers). The defect detection system 230 may compare the detected substrate defects on the two dies to determine a mask defect on the mask 208. Referring to the example of FIG. 13, a defect 1302 is identified in the substrate image 1304 for a first die of the wafer 210, and a defect 1306 is identified in the substrate image 1308 for a second die of the wafer 210. The defect detection system 230 may compare the locations of the defects 1302 and 1306, determine that the locations of the defects 1302 and 1306 match, and identify a repeating defect in the mask 208.

Figure 14:
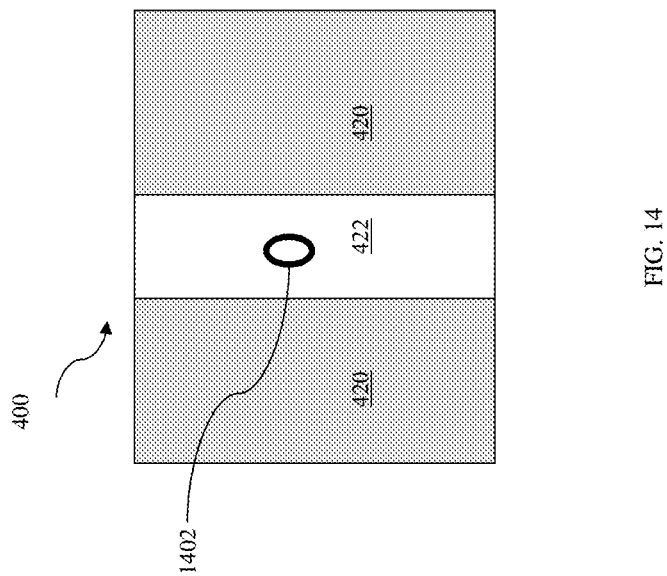
FIG. 14 illustrates a top view of a mask according to one or more aspects of the present disclosure.

Referring now to FIG. 14, illustrated is a top view of the mask 208. The defect detection system 230 may identify a repeating defect 1402 located in the reflective area 422 of the mask 400, and the location of the repeating defect 1402 corresponds to the locations of the defects 1302 and 1306 in the substrate. In some examples, the system defect 1402 is a phase defect 412 of FIG. 4.

Moreover, additional process steps may be implemented before, during, and after the method 100, and some process steps described above may be replaced or eliminated in accordance with various embodiments of the method 100.

The embodiments of the present disclosure offer advantages over existing art, though it is understood that other embodiments may offer different advantages, not all advantages are necessarily discussed herein, and that no particular advantage is required for all embodiments. One of the advantages of some embodiments is that the throughput of an e-beam inspection system may be improved by using the largest possible pixel size satisfying the detection sensitivity requirements. Another advantage of some embodiments is that the defect inspection system may efficiently identify phase defects in EUVL masks while eliminating nuisance defects by comparing the number of closed curves in a substrate image with the number of layout polygons in a design layout. Yet another advantage of some embodiments is that the impact of the substrate image distortion introduced by the SEM imaging may be reduced by using a segmental alignment process. Yet another advantage of some embodiments is that by using contour edge detection and edge connection algorithms tuned based on the design layout and SEM imaging parameters, more accurate contours are extracted from the SEM image, which improves the efficiency and accuracy of the defect inspection system.

Thus, the present disclosure provides an embodiment of a method of providing a design layout, and transferring the design layout onto a first semiconductor substrate using a mask. A scanning parameter is determined based on the design layout. An image contour including at least one closed curve from the first semiconductor substrate is generated using the determined scanning parameter. A defect inspection is performed by comparing a first number of closed curves in a region of the image contour and a second number of polygons in a corresponding region of the design layout.

The present disclosure also provides an embodiment of a method obtaining a design layout, and determining a scanning parameter based on the design layout. A first substrate and a second substrate are patterned using a mask fabricated using the design layout. A first image of the first patterned substrate and a second image of the second patterned substrate are generated using the determined scanning parameter. A first substrate defect in the first patterned substrate is identified by comparing a first number of closed curves in a first region of the first image and a second number of polygons in a first corresponding region of the design layout. A second substrate defect in the second patterned substrate may be identified by comparing a third number of closed curves in a second region of the second image and a fourth number of polygons in a second corresponding region of the design layout. A mask defect on the mask is determined by comparing the first substrate defect and the second substrate defect.

The present disclosure also provides an embodiment of a system including a processor operably coupled to a scanning tool. The processor is configured to perform the operations of determining the scanning parameter according to a design layout, providing the scanning parameter to the scanning tool, generating a substrate image of a semiconductor substrate by the scanning tool using the scanning parameter, wherein the design layout is transferred onto the semiconductor substrate using a mask, extracting closed curves in the substrate image, and performing a defect inspection by comparing a first number of closed curves in a region of the substrate image and a second number of polygons in a corresponding region of the design layout.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method, comprising:
providing a design layout;
transferring the design layout onto a first semiconductor substrate using a mask;
determining one or more scanning parameters including a scanning pixel size based on the design layout;
generating an image contour including at least one closed curve from the first semiconductor substrate using the determined one or more scanning parameters including the scanning pixel size; and
performing a defect inspection by comparing a first number of closed curves in a region of the image contour and a second number of polygons in a corresponding region of the design layout.

2. The method of claim 1, wherein the determining the one or more scanning parameters including the scanning pixel size based on the design layout includes:
computing a pitch size of the design layout by adding a minimum spacing size of the design layout and a minimum feature size of the design layout; and
providing the scanning pixel size based on the pitch size.

3. The method of claim 2, wherein the scanning pixel size is equal to about one fourth of the pitch size.

4. The method of claim 1, further includes:
identifying a first substrate defect in the first semiconductor substrate by performing the defect inspection,
detecting a second substrate defect in a second semiconductor substrate patterned using the mask; and
determining a mask defect on the mask by comparing the first substrate defect and the second substrate defect.

5. The method of claim 4, wherein a first location of the first substrate defect matches the second location of the second substrate defect.

6. The method of claim 4, wherein the mask is an EUVL mask, and
wherein the mask defect is a phase defect.

7. The method of claim 1, wherein the performing the defect inspection further includes: identifying an interconnect bridge defect disposed between the polygons,
wherein the first number is equal to one, and
wherein the second number is greater than one.

8. The method of claim 1, wherein the performing the defect inspection further includes:
identifying an interconnect open defect disposed between the closed curves,
wherein the first number is greater than one, and
wherein the second number is equal to one.

9. A method comprising:
obtaining a design layout;
determining a scanning parameter based on the design layout;
patterning a first substrate and a second substrate using a mask fabricated using the design layout;
generating a first image of the first patterned substrate and a second image of the second patterned substrate using the determined scanning parameter;
identifying a first substrate defect in the first patterned substrate by comparing a first number of closed curves in a first region of the first image and a second number of polygons in a first corresponding region of the design layout;
identifying a second substrate defect in the second patterned substrate by comparing a third number of closed curves in a second region of the second image and a fourth number of polygons in a second corresponding region of the design layout; and
determining a mask defect on the mask by comparing the first substrate defect and the second substrate defect.

10. The method of claim 9, wherein the generating the first image further includes:
using a scanning electron microscope to generate the first image using the determined scanning parameter.

11. The method of claim 9, wherein the determining the scanning parameter based on the design layout includes:
computing a pitch size of the design layout by combining a minimum spacing size of the design layout and a minimum feature size of the design layout; and
providing a pixel size based on the pitch size.

12. The method of claim 11, wherein the pixel size is equal to about one fourth of the pitch size.

13. The method of claim 9, wherein one of the first number and the second number is equal to one, and wherein the other of the first number and the second number is equal to zero or greater than one; and
wherein one of the third number and the fourth number is equal to one, and wherein the other of the third number and the fourth number is equal to zero or greater than one.

14. The method of claim 9, wherein a first location of the first substrate defect matches the second location of the second substrate defect.

15. The method of claim 9, further comprising:
aligning the first image with the design layout by separately aligning a first plurality of image segments of the first image with the design layout; and
aligning the second image with the design layout by separately aligning a second plurality of image segments of the second image with the design layout.

16. The method of claim 9, wherein the mask is an EUVL mask, and
wherein the mask defect is a phase defect.

17. A system comprising:
one or more processors operably coupled to a scanning tool, the one or more processors configured to perform the operations of:
determining a scanning parameter according to a design layout and a threshold defect size associated with a defect inspection;
providing the scanning parameter to the scanning tool;
receiving a substrate image of a semiconductor substrate generated by the scanning tool using the scanning parameter, wherein the design layout is transferred onto the semiconductor substrate using a mask;
extracting closed curves in the substrate image; and
performing the defect inspection by comparing a first number of closed curves in a region of the substrate image and a second number of polygons in a corresponding region of the design layout.

18. The system of claim 17, wherein the determining the scanning parameter based on the design layout and a threshold defect size includes:
computing a pitch size of the design layout by combining a minimum spacing size of the design layout and a minimum feature size of the design layout; and
providing a pixel size based on the pitch size.

19. The system of claim 17, wherein one of the first number and the second number is equal to one, and wherein the other of the first number and the second number is equal to zero or greater than one.

20. The system of claim 17, wherein the one or more processors are configured to perform the operations of:
aligning the substrate image with the design layout by separately aligning a plurality of image segments of the substrate image with the design layout.

* * * * *